(12) United States Patent
Dubin et al.

(10) Patent No.: US 7,442,634 B2
(45) Date of Patent: Oct. 28, 2008

(54) METHOD FOR CONSTRUCTING CONTACT FORMATIONS

(75) Inventors: Valery M. Dubin, Portland, OR (US); Tzuen-Luh Huang, Portland, OR (US); Ming Fang, Portland, OR (US); Kevin J. Lee, Beaverton, OR (US); Yuehai Liang, Portland, OR (US); Margherita Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 11/019,857

(22) Filed: Dec. 21, 2004

(65) Prior Publication Data

US 2006/0134902 A1 Jun. 22, 2006

(51) Int. Cl.
*H01L 21/44* (2006.01)

(52) U.S. Cl. .................. 438/613; 438/612; 438/676

(58) Field of Classification Search ................ 438/612, 438/613, 614, 615, 658, 659, 674, 679, 610, 438/768, 676
See application file for complete search history.

(56) References Cited

U.S. PATENT DOCUMENTS

| | | | |
|---|---|---|---|
| 5,972,192 A | 10/1999 | Dubin et al. | |
| 6,667,229 B1 * | 12/2003 | Lin et al. | 438/611 |
| 7,128,823 B2 * | 10/2006 | Yang et al. | 205/296 |
| 2003/0159941 A1 * | 8/2003 | Bajaj et al. | 205/296 |
| 2003/0168343 A1 | 9/2003 | Commander et al. | |
| 2004/0023481 A1 * | 2/2004 | Desai et al. | 438/612 |
| 2004/0154926 A1 | 8/2004 | Sun et al. | |
| 2004/0187731 A1 * | 9/2004 | Wang et al. | 106/1.13 |
| 2004/0217008 A1 * | 11/2004 | Tsuchida et al. | 205/291 |

FOREIGN PATENT DOCUMENTS

| | | |
|---|---|---|
| EP | 1 069 211 A2 | 1/2001 |
| WO | PCT/US2005/047000 | 12/2005 |

* cited by examiner

*Primary Examiner*—Kevin M Picardat
(74) *Attorney, Agent, or Firm*—Blakely, Sokoloff, Taylor & Zafman LLP (57) ABSTRACT

According to one aspect of the invention, a method for forming contact formations is provided. A substrate may be placed in an electrolytic solution. The substrate may have an exposed conductive portion and the electrolytic solution may include a plurality of metallic ions and an accelerator. The accelerator may include at least one of bis-(sodium sulfopropyl)-disulfide and 3-mercapto-1-propanesulfonic acid-sodium salt. A voltage may be applied across the electrolytic solution and the conductive portion of the substrate to cause the metallic ions to be changed into metallic particles and deposited on the conductive portion. The electrolytic solution may also include a protonated organic additive. The electrolytic solution may also include an acid and a surfactant. The acid may include at least one of sulfuric acid, methane sulfonic acid, benzene sulfonic acid, and picryl sulfonic acid. The surfactant may include at least one of polyethylene glycol and polypropylene glycol.

60 Claims, 12 Drawing Sheets

METHOD FOR CONSTRUCTING CONTACT FORMATIONS

BACKGROUND OF THE INVENTION

1). Field of the Invention

Embodiments of this invention relate to a method for the formation of contact formations, particularly for use on semiconductor substrates and a system utilizing such contact formations.

2). Discussion of Related Art

Integrated circuits are formed on semiconductor substrates, such as wafers. The wafers are then sawed (or "singulated" or "diced") into microelectronic dice, also known as semiconductor chips, with each chip carrying a respective integrated circuit. Each semiconductor chip is then mounted to a package, or carrier, substrate. Often the packages are then mounted to circuit boards, such as motherboards, which may then be installed in computing systems.

The package substrates provide structural integrity to the semiconductor chips and are used to connect the integrated circuits electrically to the motherboard. On the side of the package substrate connected to the motherboard, there are contact formations, such as Ball Grid Array (BGA) solder balls, which are soldered to the motherboard. Electric signals are sent through the BGA solder balls into and out of the package. On the other side of the package substrate, there are other, smaller contact formations used to connect the dice to the package substrate. A modern trend for these contact formations is the use of "copper bumps" which are formed on bonding pads on the dice. An underfill material, such as an epoxy or paste, may also be present between the dice and the packages.

Copper bumps are typically formed using an electroplating process. The formation of the bumps begins within a depression on the surface of the dice. This depression leads to a "dimple," or other formations, on the surface of the copper bumps opposite the dice. It is this dimpled surface which is used to connect the dice to the packages.

This dimple is undesirable because it allows material, such as solder, underfill material, or even air, to get caught between the copper bump and the package substrate when the chip-to-package connections are made. This trapped material weakens the strength of the mechanical bond between the dice and package substrates and results in a decease in the maximum amount of current that can be conducted through the copper bumps.

BRIEF DESCRIPTION OF THE DRAWINGS

Embodiments of the invention are described by way of example with reference to the accompanying drawings, wherein.

DETAILED DESCRIPTION OF THE INVENTION

In the following description, various aspects of the present invention will be described, and various details set forth in order to provide a thorough understanding of the present invention. However, it will be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1A-9 are merely illustrative and may not be drawn to scale.

FIG. 1A to FIG. 9 illustrate a method for forming contact formations and a system utilizing the contact formations. A substrate may be placed in an electrolytic solution. The substrate may have an exposed conductive portion and the electrolytic solution may include a plurality of metallic ions and an accelerator. The accelerator may include at least one of bis-(sodium sulfopropyl)-disulfide and 3-mercapto-1-propanesulfonic acid-sodium salt. A voltage may be applied across the electrolytic solution and the conductive portion of the substrate to cause the metallic ions to be changed into metallic particles and deposited on the conductive portion. The electrolytic solution may also include a protonated organic additive. The electrolytic solution may also include an acid and a surfactant. The acid may include at least one of sulfuric acid, methane sulfonic acid, benzene sulfonic acid, picryl sulfonic acid, ethane sulfonic acid, and propane sulfonic acid. The surfactant may include at least one of polyethylene glycol and polypropylene glycol. The contact formations may be "copper bumps," as is commonly understood in the art, and may have domed, or flat, upper surfaces.

Figure 1A:
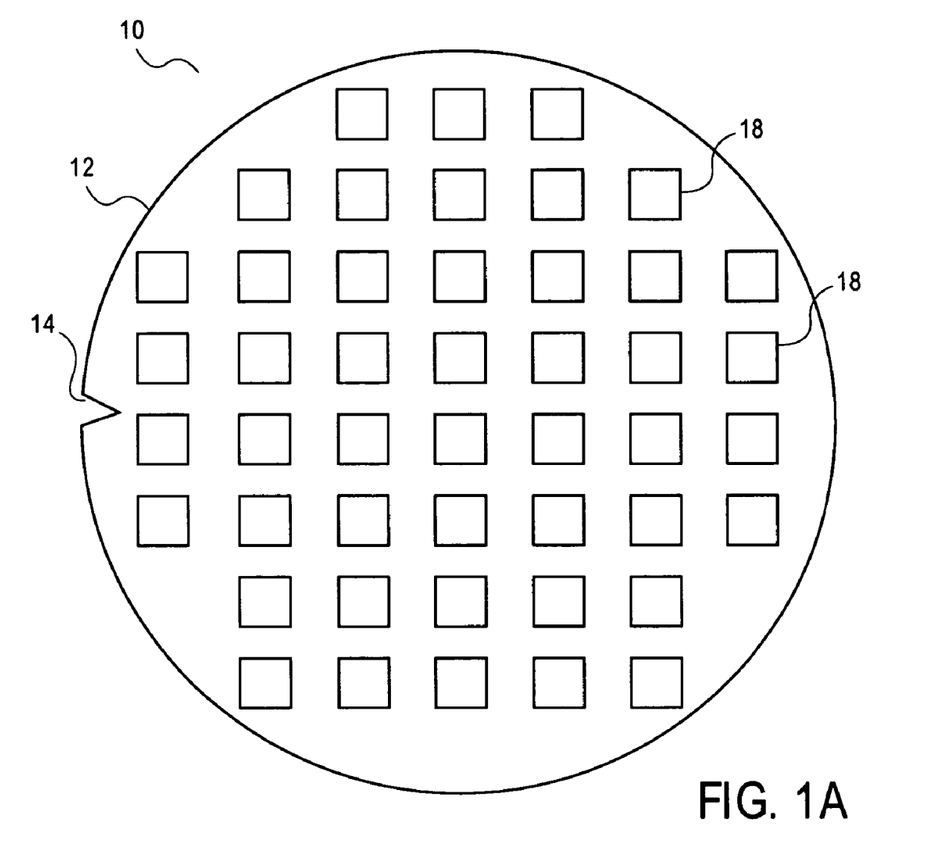
FIG. 1A is a top plan view of a semiconductor substrate.
Figure 1B:
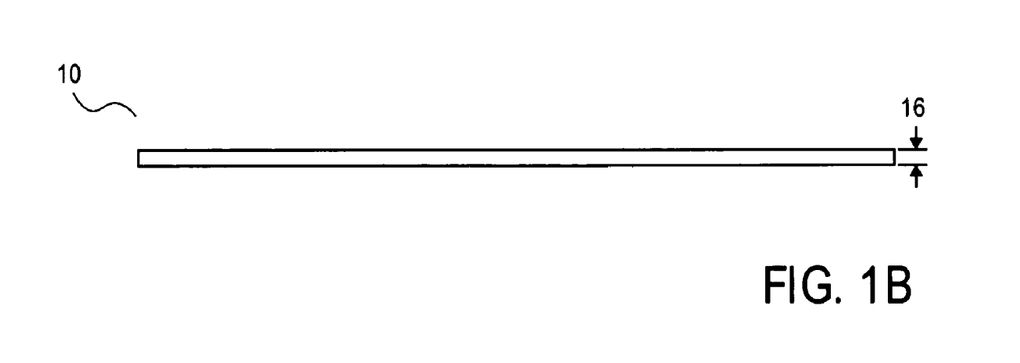
FIG. 1B is a cross-sectional side view of the semiconductor substrate illustrated in FIG. 1A.

FIGS. 1A and 1B illustrate a semiconductor substrate 10. The semiconductor substrate 10 may be a semiconductor wafer with a circular outer edge 12, having a diameter of, for example, 200 or 300 mm, and an indicator 14 thereon. The semiconductor substrate 10 may have a thickness 16 of, for example, 0.7 mm and a plurality of integrated circuits, separate amongst multiple dice 18, formed thereon.

Figure 2A:
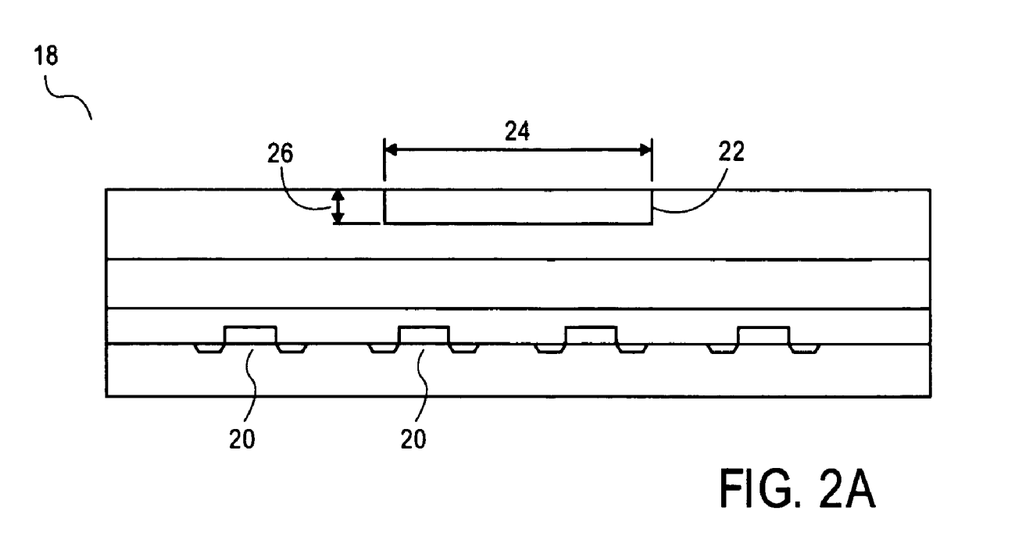
FIG. 2A is a cross-sectional side view of a microelectronic die, or a portion of the semiconductor substrate illustrated in FIG. 1A.

FIG. 2A illustrates one of the dice 18, or another portion of the semiconductor substrate 10 illustrated in FIGS. 1A and 1B. Each die 18 may include an integrated circuit, such as a microprocessor formed therein, which may include multiple transistors and capacitors 20. The die 18 may also include a plurality of alternating insulating and conducting layers and be in what is known as a "flip-chip" configuration, as is commonly understood in the art. The die 18 may also include a bonding pad 22 formed within an upper surface thereof. The bonding pad may have, for example, a width 24 of approximately 10 microns and a thickness 26 of approximately 1 micron. The bonding pad 22 may be made of a conductive material, such as copper, and may be formed using electroplating. The bonding pad 22 may be part of the integrated circuit, or be electrically connected to the integrated circuit within the die 18.

Figure 2B:
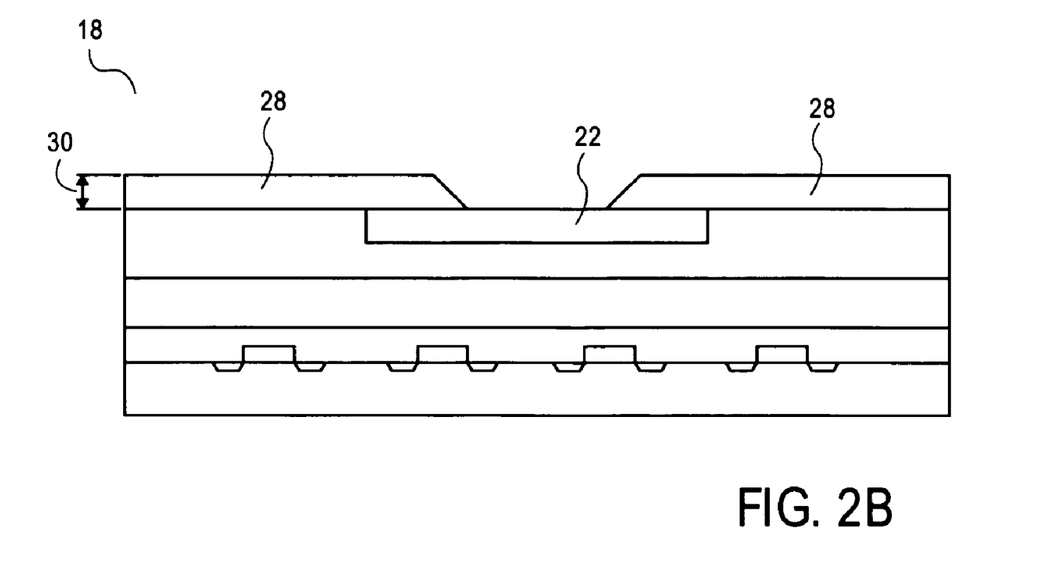
FIG. 2B is a cross-sectional side view of the microelectronic die with a passivation layer formed thereon.

FIG. 2B illustrates the die 18 with a passivation layer 28 formed thereon. The passivation layer 28 may have a thickness of, for example, approximately 2 microns and may be selectively deposited or etched so that a central portion of the bonding pad 22 remains exposed. Although not illustrated in the detail, the passivation layer 28 may include an upper layer made of, for example, polyimide or benzocyclobutene, formed over a lower layer made of a nitride, such as silicon nitride (SiN) or silicon oxide nitride (SiON).

Figure 2C:
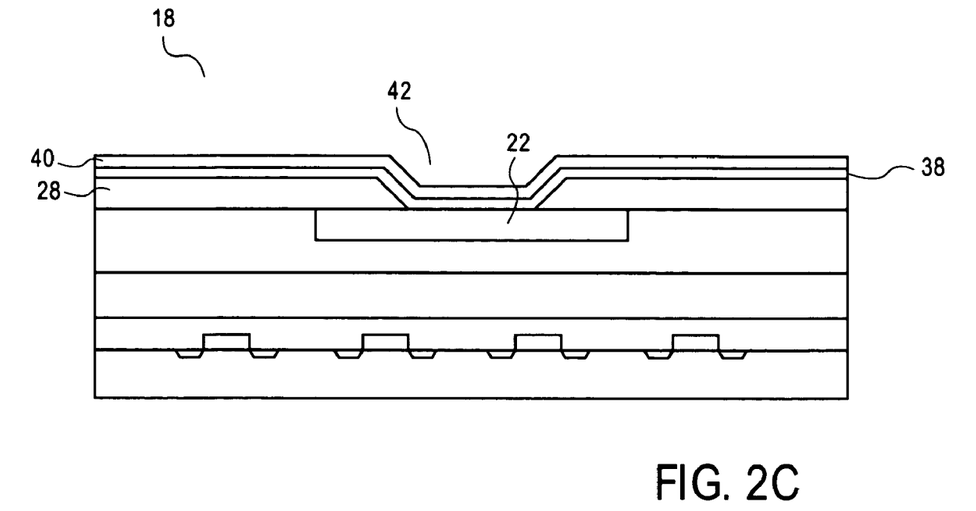
FIG. 2C is a cross-sectional side view of the microelectronic die with an adhesion layer and a seed layer formed over the passivation layer.

FIG. 2C illustrates the die 18 with an adhesion layer 38 and a seed layer 40 deposited over the passivation layer 28 and the exposed portion of the bonding pad 22. The adhesion layer 38 may be made of a conductive material such as titanium, titanium nitride, tantalum, tantalum nitride, tantalum silicon nitride, tungsten nitride, tungsten silicon nitride, titanium tungsten, cobalt nickel tungsten phosphorus, cobalt nickel rhenium phosphorus, cobalt nickel tungsten boron, cobalt nickel rhenium boron, cobalt nickel tungsten boron phosphorus, and/or cobalt nickel rhenium boron phosphorus. The adhesion layer 38 may be deposited by such methods as plasma vapor deposition (PVD), chemical vapor deposition (CVD), atomic layer deposition (ALD), and electroless plating. The adhesion layer 38 may have a thickness of, for example, between 10 and 1000 nanometers and may be formed over the exposed portion of the bonding pad 22.

The seed layer 40 may be made of a conductive material such as, for example, copper, silver, gold, nickel, and/or cobalt and may be deposited using PVD, CVD, ALD, electroless plating, and electroplating. The seed layer 40 may have a thickness of, for example, between 10 and 10,000 nanometers and may be formed directly over the adhesion layer 38. Due to the shape of the adhesion layer 38 and the passivation layer 28, the seed layer 40 may have a depression 42 and an upper surface thereof.

Figure 2D:
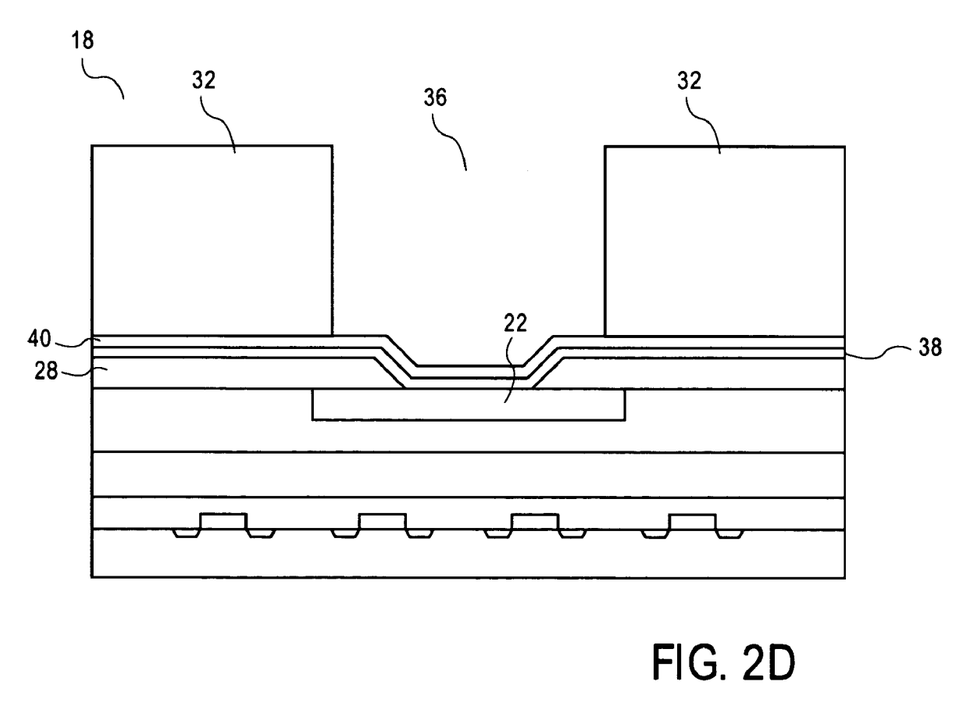
FIG. 2D is a cross-sectional side view of the microelectronic die with a photoresist layer formed over the seed layer.

FIG. 2D illustrates the die 18 with a photoresist layer 32 formed over the passivation layer 28. The photoresist layer 32 may have a thickness of, for example, between 10 and 100 microns and may be selectively deposited or etched not to cover the portion of the passivation layer 28 covering the exposed portion bonding pad 22, as illustrated in FIG. 2D, to form a trench 36. The trench 36 may be positioned directly above the bonding pad 22.

Figure 3:
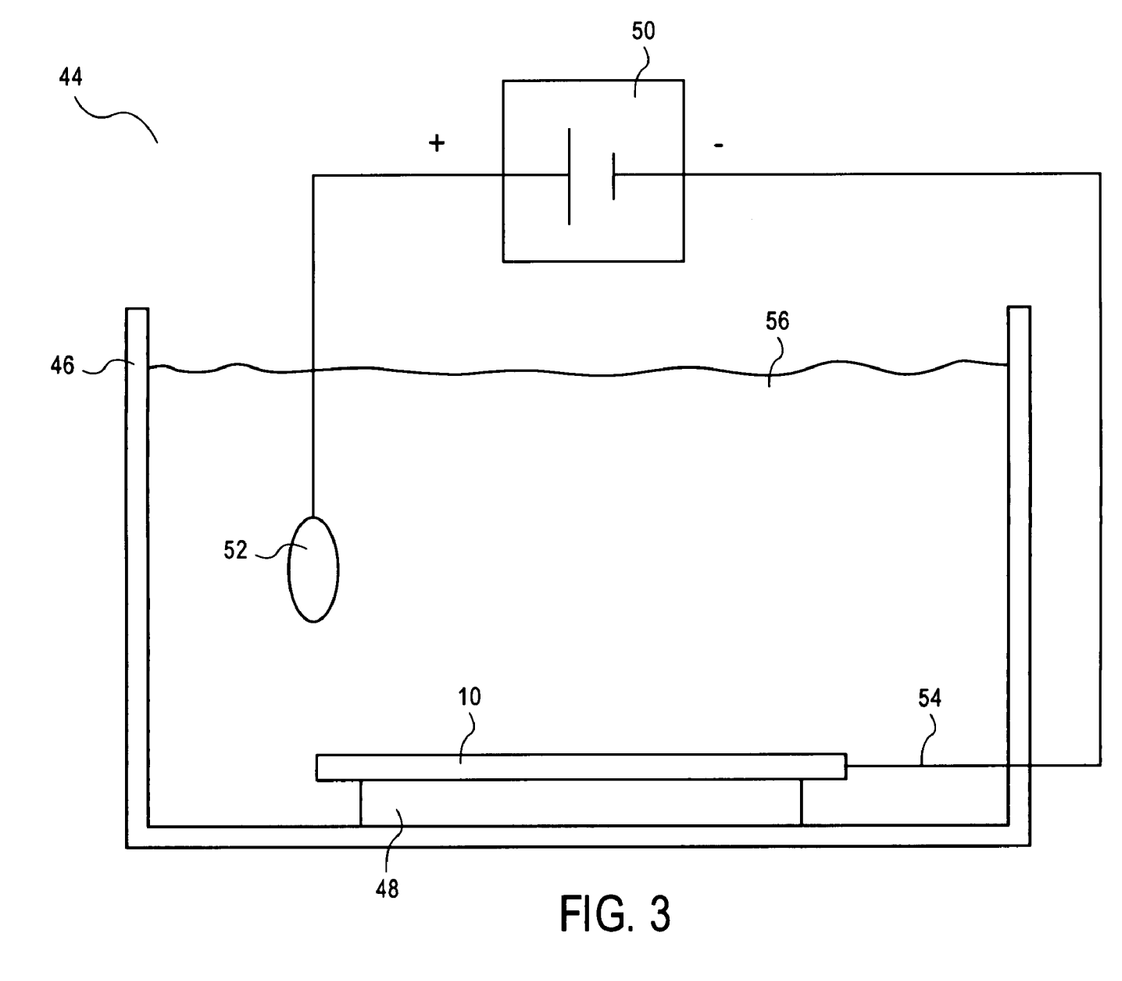
FIG. 3 is a cross-sectional schematic view of an electroplating apparatus.

FIG. 3 illustrates an electroplating apparatus 44. The electroplating apparatus 44 may include a liquid container 46, a substrate support 48 within the container 46, and a voltage supply 50 having a first electrode 52 and a second electrode 54. The container 46 may contain an electrolytic solution 56 so that both of the electrodes 52 and 54 are completely immersed therein.

The electrolytic solution 56 may include a common electrolyte, metallic ions, a surfactant, an accelerator, and a leveler. The common electrolyte may be an acid such as, for example, sulfuric acid, methane sulfonic acid, benzene sulfonic acid, picryl sulfonic acid, ethane sulfonic acid, and propane sulfonic acid. The concentration of the common electrolyte within the electrolytic solution 56 may be between approximately 5 grams per liter (g/L) and 150 g/L. The metallic ions may be cupric ions provided by copper sulfate ($CuSO_4$) added to the electrolytic solution 56. The concentration of the cupric ions within the electrolytic solution 56 may be between 10 g/L and 60 g/L. The surfactant may be polyethylene glycol (PEG) polypropylene glycol (PPG), and/or the derivatives of PEG and PPG. The concentration of the surfactant within the electrolytic solution 56 may be between 0.5 g/L and 2 g/L. The accelerator may be bis-(sodium sulfopropyl)-disulfide (SPS) and/or 3-mercapto-1-propanesulfonic acid-sodium salt (MPS). The concentration of the accelerator within the electrolytic solution 56 may be between 10 parts per million (ppm) and 500 ppm. The leveler may be a protonated organic additive, such as polyamine or polyimide. The concentration of the leveler within the electrolytic solution 56 may be between 0.5 g/L and 2 g/L.

Still referring to FIG. 3, the semiconductor substrate 10 may be placed on the substrate support 48 within the liquid container 46 of the electroplating apparatus 44 so that the semiconductor substrate 10 is completely immersed within the electrolytic solution 56. The second electrode 54 may be connected to the semiconductor substrate 10 such that the second electrode 54 is electrically connected to each of the bonding pads 22, or the adhesion layer 38, as illustrated in FIG. 2D, and thus the exposed seed layer 40. Referring again to FIG. 3, the voltage supply 50 may then apply a voltage across the first 52 and second 54 electrodes. The voltage supplied may be between 1.5 and 120 volts.

Figure 4A:
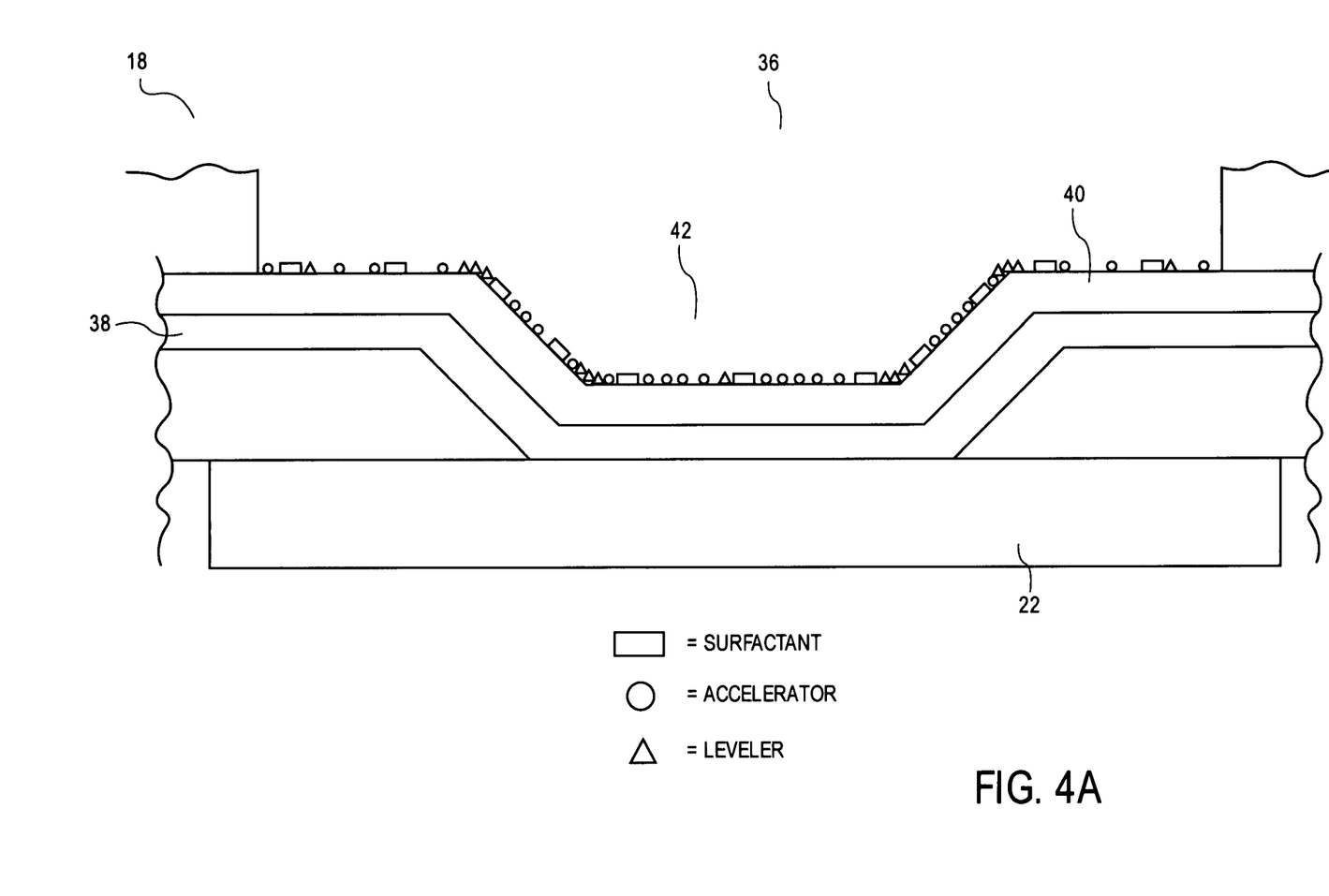
FIGS. 4A and 4B are cross-sectional schematic views of the microelectronic die illustrating the formation of a contact formation within a trench in the photoresist layer.

FIG. 4A illustrates one of the dice 18 on the semiconductor substrate 10 as the semiconductor substrate 10 is immersed within the electrolytic solution 56 illustrated in FIG. 3. As illustrated specifically in FIG. 4A, particles of the surfactants, the accelerator, and the leveler are deposited on an upper surface of the seed layer 40 within the trench 36. As illustrated, the surfactant is deposited relatively uniformly across the upper surface of the seed layer 40. However, particles of the accelerator may tend to collect within the depression 42 on the upper surface of the seed layer 40. Therefore, the ratio of accelerator particles to surfactant particles may be higher within the depression 42 than on areas not within the depression. Particles of the leveler may tend to collect at the "corners" of the depression 42 as illustrated in FIG. 4A.

Figure 4B:
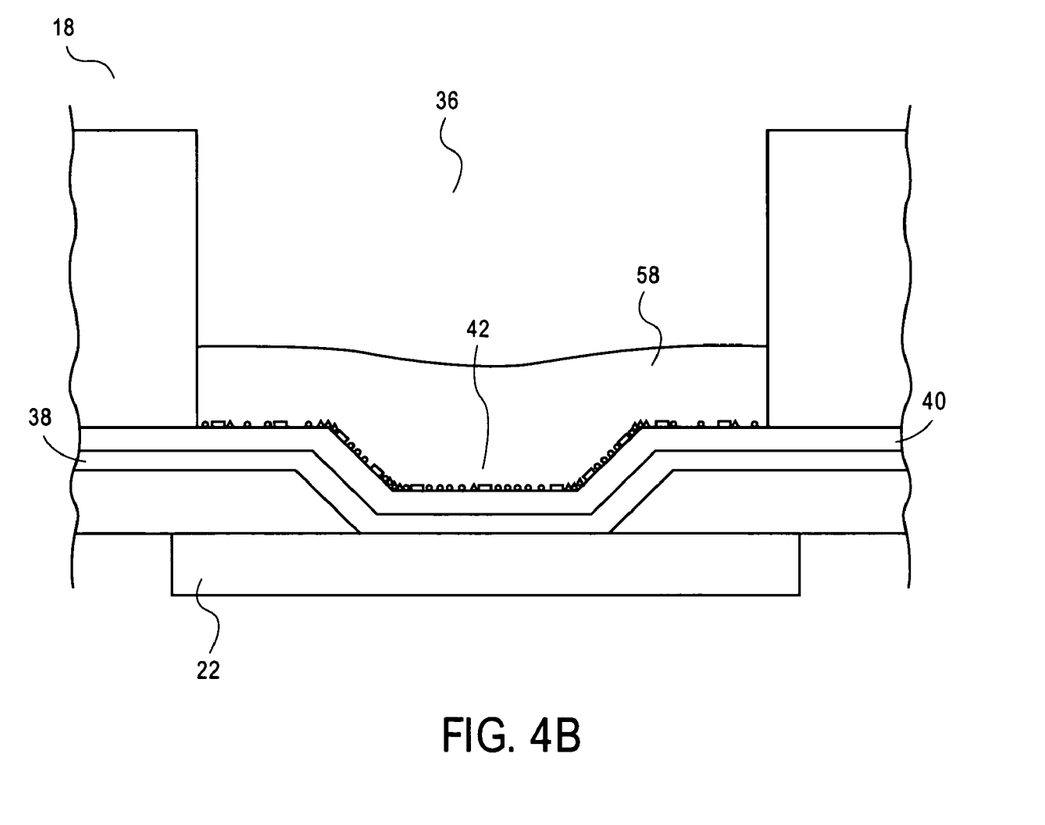

As illustrated in FIGS. 4A and 4B, while the voltage is applied across the first and second electrodes, the cupric ions within the electrolytic solution 56 may undergo a reduction process, or become reduced to metal, and become deposited, or "electroplated", as is commonly understood in the art, on the seed layer 40.

During the electroplating process, the surfactant particles improve wettability and suppress the plating rate to prevent a dendritic copper deposit from forming. The accelerator particles may act to increase the electroplating rate. The leveler particles may passivate the more-negatively charged areas during electroplating. Because of the distribution of the surfactant particles, the accelerator particles, and the leveler particles illustrated in FIG. 4A, the electroplating process may occur more quickly within the depression 42 on the upper surface of the seed layer 40. As illustrated specifically in FIG. 4B, a contact formation 58 may be formed during the electroplating process within the trench 36. As shown a central portion of the contact formation 58, located directly over the depression 42 may form more rapidly than portions of the contact formation 58 not located directly over the trench 42.

Figure 5A:
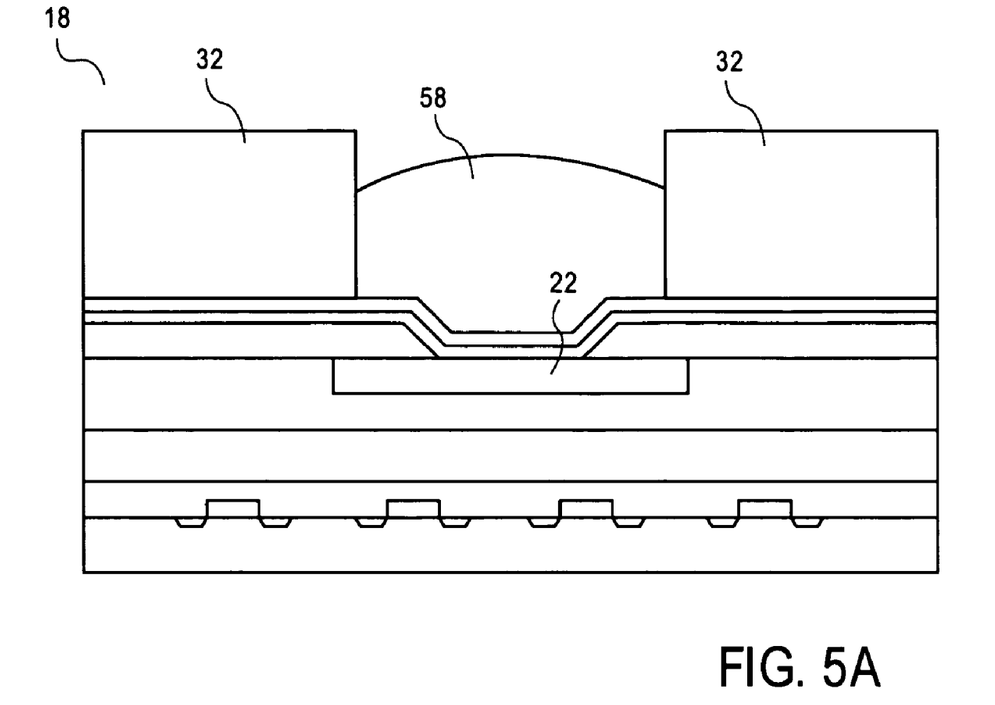
FIGS. 5A and 5B are cross-sectional side views of the microelectronic die illustrating the removal of the photoresist layer.

FIG. 5A illustrates the die 18 after the completion of the electroplating process illustrated in FIGS. 4A and 4B. The contact formation 58 may be a "copper bump," as in commonly understood in the art, and have a "domed" upper surface. The semiconductor substrate 10 may then be removed from the electrolytic solution 56, and the photoresist layer 32 may then be removed by known processes, such as plasma ashing, and the adhesion 38 and seed 40 layers may be removed from in between the copper bumps 58 by known wet and dry etch processes, as illustrated FIG. 5B.

Figure 5B:
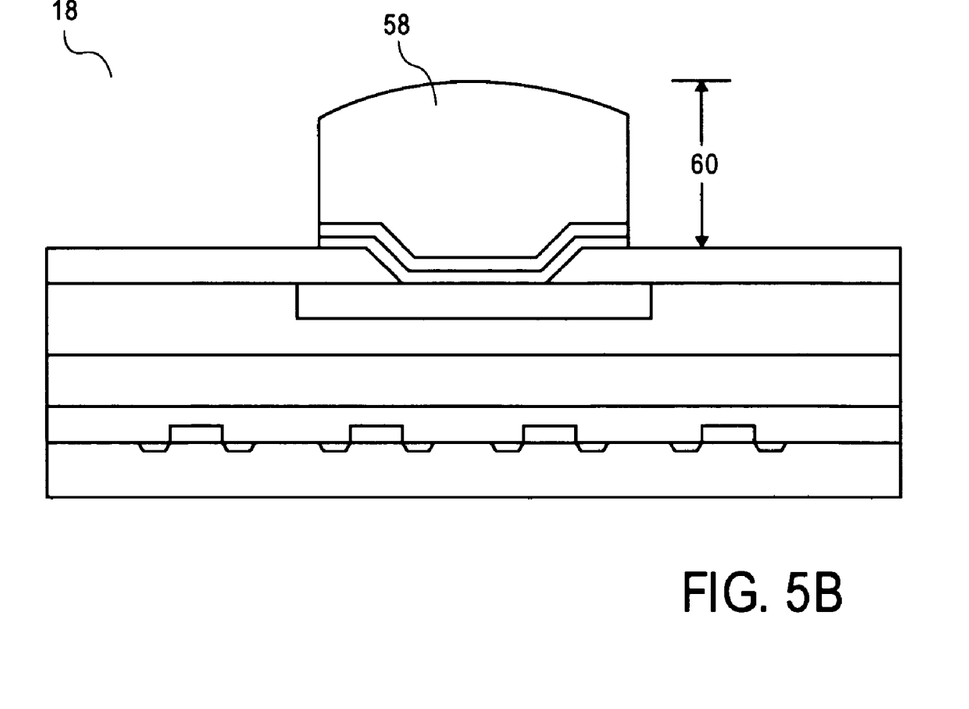

Still referring to FIG. 5B, the contact formation 58 may have a height 60 between 10 microns and 100 microns, and a surface roughness of between 1 and 500 Å root mean square (RMS).

Figure 6:
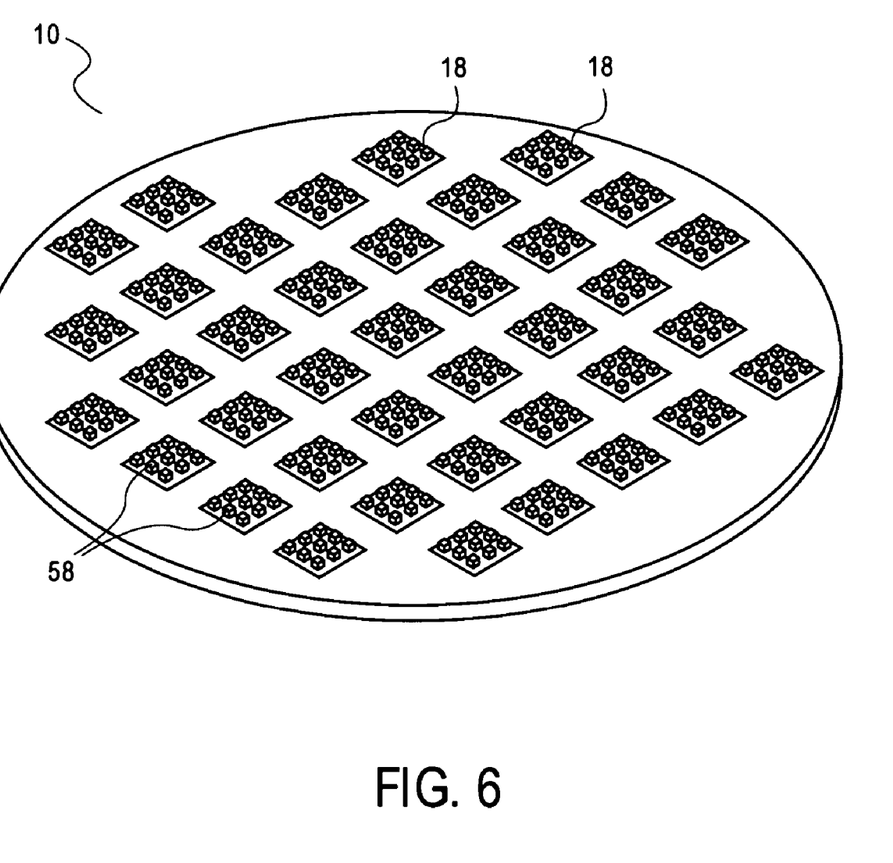
FIG. 6 is a perspective view of the semiconductor substrate with a plurality of contact formations formed thereon.

FIG. 6A illustrates the semiconductor substrate 10 after the removal of the photoresist layer 32. As illustrated, each of the dice 18 may now have a plurality of contact formations 58 connected thereto. Although the dice 18 are illustrated as having only nine contact formations 58 thereon, it should be understood that each die 18 may have literally hundreds (or more) of contact formations 58 thereon. The dice 18 may then be separated, or cingulated, from the semiconductor wafer 10 into separate microelectronic dice 18.

Figure 7A:
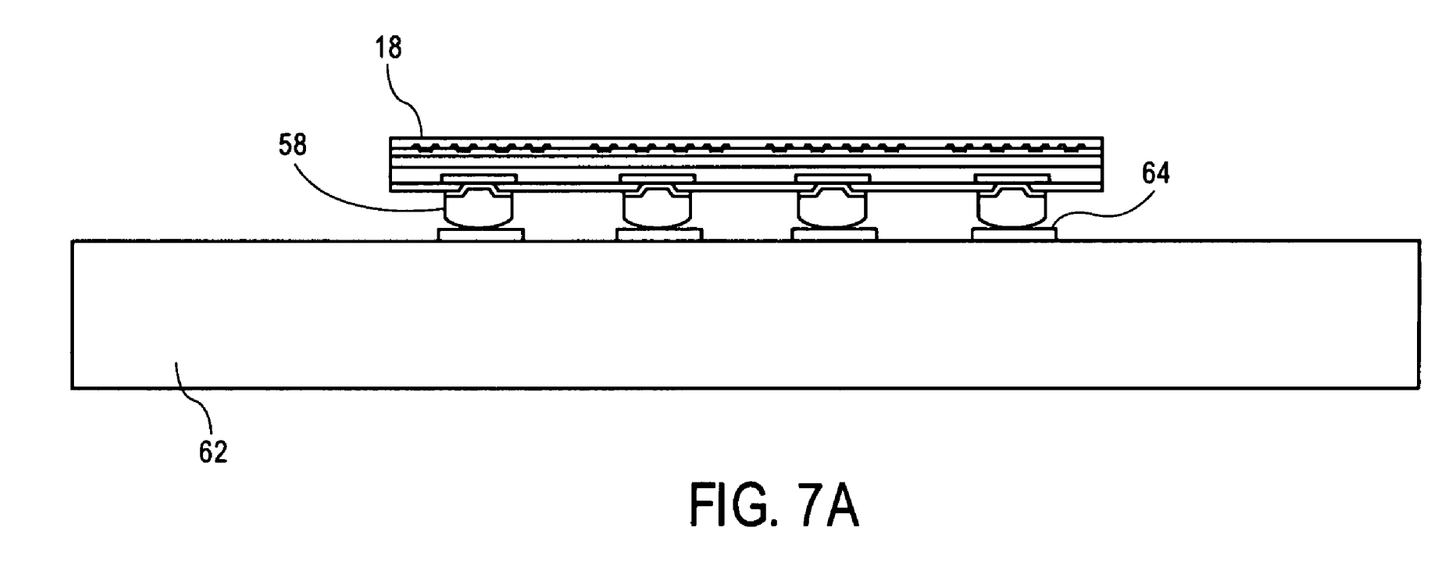
FIG. 7A is a cross-sectional side view of the microelectronic die attached to a printed circuit board.
Figure 7B:
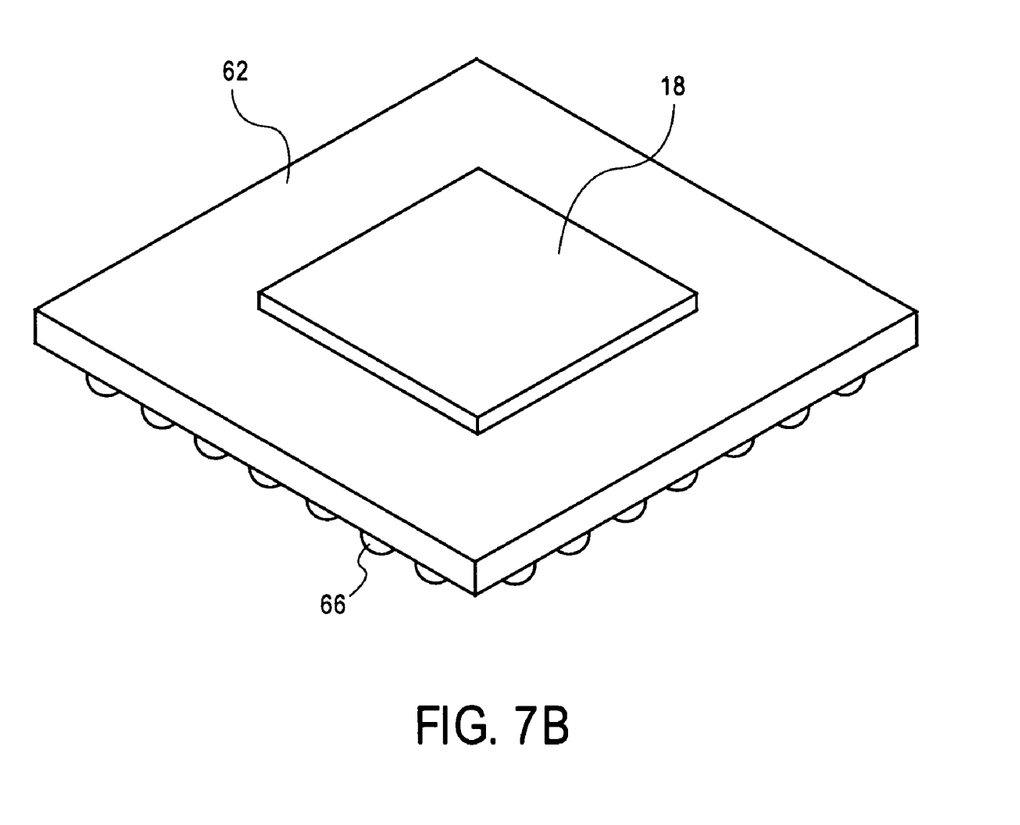
FIG. 7B is a perspective view of the microelectronic die attached to the printed circuit board.

As illustrated in FIGS. 7A and 7B, the dice 18 may then be attached to a package substrate 62. The package substrate 62 may be square with, for example, side lengths of approximately 3 cm and a thickness of 3 mm. The package substrate 62 may include alternating conducting and insulating layers formed therein, as is commonly understood in the art. As illustrated specifically in FIG. 7A, the package substrate 62 may include contact pads 64 formed on an upper surface thereof. The contact pads 64 may be made of, for example, a conductive material such as solder or copper. The contact pads 64 may be electrically connected to the conducting layers within the package substrate 62. The contact formations 58 may be connected to the contact pads 64 by known processes, such as reflow and thermocompression. As illustrated in FIG. 7B, Ball Good Array (BGA) solder ball contact formations 66 or other suitable contact formations, may be connected to a lower surface of package substrate 62.

Figure 8:
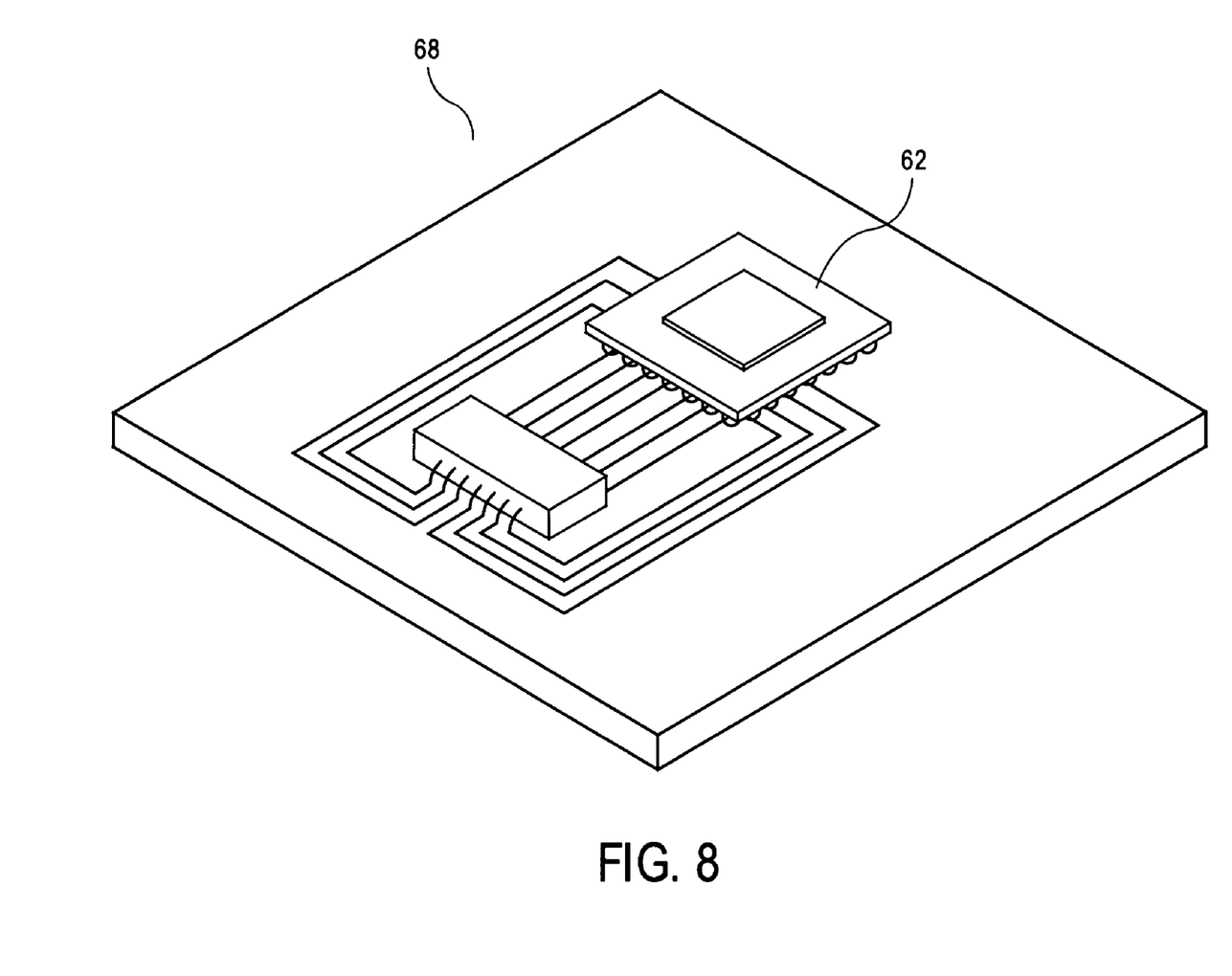
FIG. 8 is a perspective view of the package substrate attached to a printed circuit board.

FIG. 8 illustrates the package substrate 62 attached to a printed circuit board 68, such as a motherboard. The motherboard 68 may be a large silicon plane having a plurality of sockets for securing and providing electrical signals to various package substrates, microelectronic dice, and other electronic devices, as well as conductive traces to electrically connect such devices, as is commonly understood in the art. Although not illustrated in detail, the BGA solder balls 66 may be heated and bonded to a socket on the motherboard 68. Additionally, an underfill material, such as an adhesive paste or epoxy, may be deposited between the die 18 and the package substrate 62, as is commonly understood in the art.

In use, the motherboard 68 may be installed in a computing system. Electric signals such as input/output (IO) signals, are then sent from the integrated circuit within the die 18 through the contact formations 58, into the package substrate 62, and into the computing system through the motherboard 68. Power and ground signals may also be provided to the die 18. The computing system may send similar, or different, signals back to the integrated circuit within the die 18 through the motherboard 68, the package substrate 62, and the contact formations 58.

One advantage is that because of the domed shape and the smooth upper surface of the copper bumps, when the die is attached to the package substrate, the likelihood of any solder material, underfill material, or air being trapped between the copper bump and the package substrate is reduced. Therefore, the mechanical strength of the bond between the copper bumps and the package substrates is increased, resulting in a more reliable electrical connection. Another advantage is that a greater portion of the copper bumps may be an electrical contact with the package substrate, allowing the amount of current that is conducted through each copper bump to be maximized.

Other embodiments may use an electrolytic solution that does not contain the leveler. A two-step electroplating process may also be used. In the two-step electroplating process, one step may use an electrolytic solution that does not contain the accelerator or the leveler. While the other electroplating step may use the electrolytic solution described above with the accelerator and/or the leveler. The contact formations resulting from these alternative embodiments may not be domed to the same extent as the copper bump illustrated in FIG. 5B, as the upper surfaces thereof may be substantially flat.

Figure 9:
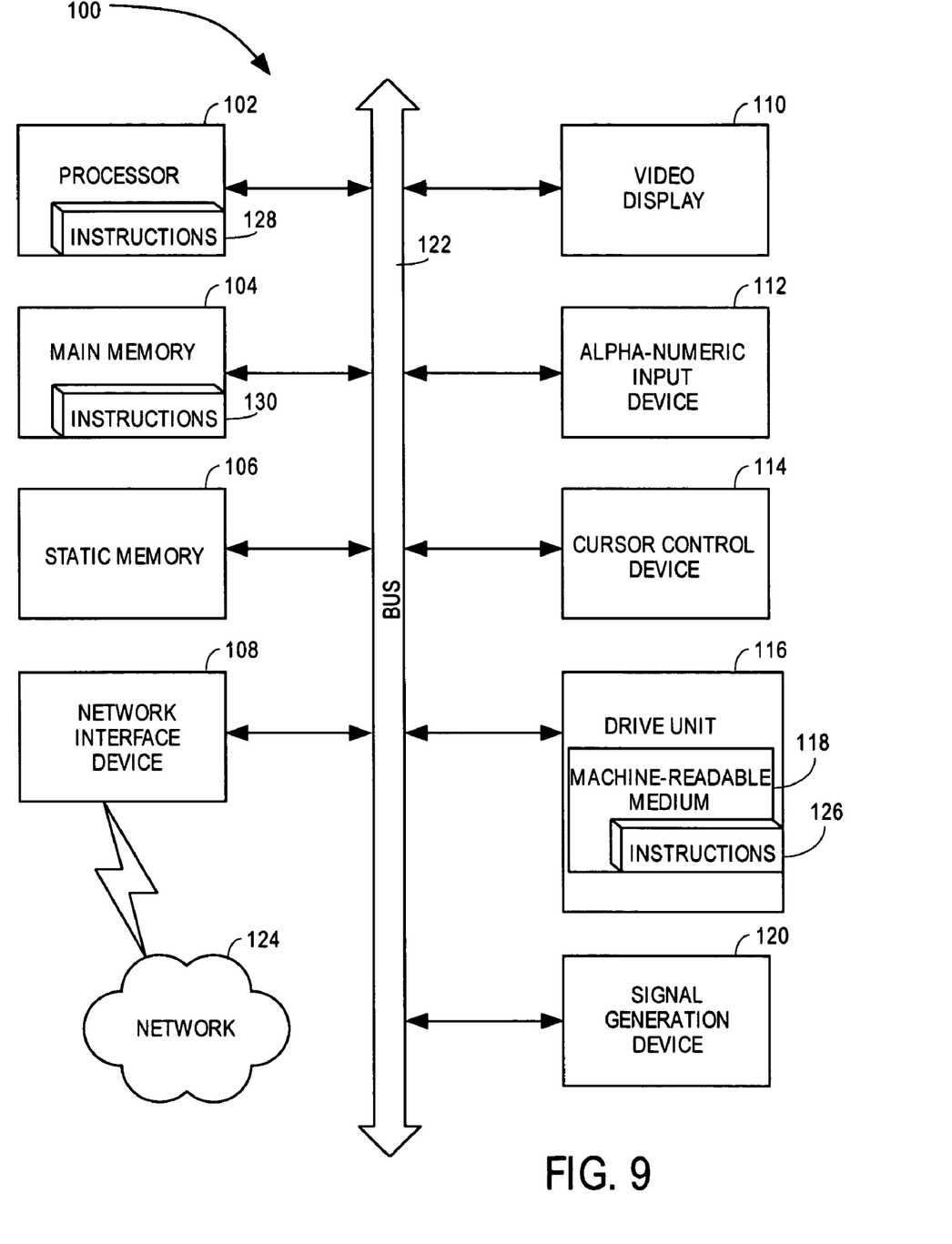
FIG. 9 is a block diagram of a computing system.

FIG. 9 illustrates a computing system 100 into which the dice, packages, and printed circuit boards described above may be installed. The computing system may include a processor 102, a main memory 104, a static memory 106, a network interface device 108, a video display device 110, an alphanumeric input device 112, a cursor control device 114, a drive unit 116 including a machine-readable medium 118, and a signal generation device 120. All the components of the computing system 100 may be interconnected by a bus 122. The computing system 100 may be connected to a network 124 through the network interface device 108. The machine-readable medium 118 may include a set of instructions 126, which may be partially transferred to the processor 102 and the main memory 104 through the bus 122. The processor 102 and the main memory 104 may also have separate internal sets of instructions 128 and 130.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method comprising:
    placing a substrate in an electrolytic solution, the substrate having an exposed conductive portion bordered by a non-conductive wall, the electrolytic solution including a plurality of metallic ions and an accelerator, the accelerator comprising bis-(sodium sulfopropyl)-disulfide; and
    applying a voltage across the electrolytic solution and the conductive portion of the substrate to cause the metallic ions to be reduced to metal and deposited on the conductive portion,
    wherein the deposition forms a domed upper surface.

2. The method of claim 1, wherein the electrolytic solution further comprises a protonated organic additive.

3. The method of claim 2, wherein the protonated organic additive comprises at least one of polyamine and polyimide.

4. The method of claim 3, wherein the electrolytic solution further comprises an acid.

5. The method of claim 4, wherein the electrolytic solution further comprises a surfactant.

6. The method of claim 5, wherein the acid comprises at least one of sulfuric acid, methane sulfonic acid, benzene sulfonic acid, picryl sulfonic acid, ethane sulfonic acid, and propane sulfonic acid.

7. The method of claim 6, wherein the surfactant comprises at least one of polyethylene glycol and polypropylene glycol.

8. The method of claim 7, wherein the metallic ions are copper ions.

9. The method of claim 8, wherein a concentration of the accelerator is between approximately 10 ppm and 500 ppm.

10. The method of claim 9, wherein a concentration of the protonated organic additive is between approximately 0.5 g/L and 2 g/L.

11. The method of claim 10, wherein a concentration of the acid is between approximately 5 g/L and 150 g/L and a concentration of the metallic ions is between approximately 10 g/L and 60 g/L.

12. The method of claim 11, wherein a concentration of the surfactant is between approximately 0.5 g/L and 2 g/L.

13. The method of claim 12, wherein the substrate is a semiconductor substrate having an integrated circuit formed therein and the conductive portion is electrically connected to the integrated circuit.

14. A method for forming contact formations on a semiconductor substrate comprising:
placing said semiconductor substrate in an electrolytic solution, the semiconductor having at least one integrated circuit formed therein and at least one exposed conductive portion bordered by a non-conductive wall, the exposed conductive portion being electrically connected to the at least one integrated circuit, the electrolytic solution including a plurality of metallic ions and an accelerator, the accelerator comprising bis-(sodium sulfopropyl)-disulfide; and
applying a voltage across the electrolytic solution and the at least one conductive portion of the substrate to cause the metallic ions to be reduced to metal and deposited on the at least one conductive portion to form at least one contact formation on the at least one conductive portion, wherein the deposition forms a domed upper surface.

15. The method of claim 14, wherein the electrolytic solution further comprises a protonated organic additive.

16. The method of claim 15, wherein the protonated organic additive comprises at least one of polyamine and polyimide.

17. The method of claim 16, wherein the electrolytic solution further comprises an acid.

18. The method of claim 17, wherein the electrolytic solution further comprises a surfactant.

19. The method of claim 18, wherein the acid comprises at least one of sulfuric acid, methane sulfonic acid, benzene sulfonic acid, picryl sulfonic acid, ethane sulfonic acid, and propane sulfonic acid.

20. The method of claim 19, wherein the surfactant comprises at least one of polyethylene glycol and polypropylene glycol.

21. The method of claim 20, wherein the metallic ions are copper ions.

22. The method of claim 21, wherein a concentration of the accelerator is between approximately 10 ppm and 500 ppm.

23. The method of claim 22, wherein a concentration of the protonated organic additive is between approximately 0.5 g/L and 2 g/L.

24. The method of claim 23, wherein a concentration of the acid is between approximately 5 g/L and 150 g/L and a concentration of the metakc ions is between approximately 10 g/L and 60 g/L.

25. The method of claim 24, wherein a concentration of the surfactant is between approximately 0.5 g/L and 2 g/L.

26. The method of claim 25, wherein the integrated circuit is a microprocessor.

27. A method for forming contact formations on a semiconductor substrate comprising:
placing said semiconductor substrate in a first electrolytic solution, the semiconductor having at least one integrated circuit formed therein and at least one exposed conductive portion being electrically connected to the at least one integrated circuit, the first electrolytic solution including a plurality of metallic ions;
applying a voltage across the electrolytic solution and the at least one conductive portion of the substrate while the semiconductor substrate is within the first electrolytic solution to cause a portion of the plurality of metallic ions to be reduced to metal and deposited on the at least one conductive portion;
placing said semiconductor substrate in a second electrolytic solution, the second electrolytic solution including said plurality of metallic ions and an accelerator, the accelerator comprising bis-(sodium sulfopropyl)-disulfide; and
applying a voltage across the electrolytic solution and the at least one conductive portion of the substrate while the semiconductor substrate is within the second electrolytic solution to cause the a portion of the plurality of metallic ions to be reduced to metal and deposited on the at least one conductive portion to form at least one contact formation on the at least one conductive portion.

28. The method of claim 27, wherein the second electrolytic solution further comprises a protonated organic additive.

29. The method of claim 28, wherein the plurality of metallic ions is copper ions.

30. The method of claim 29, wherein the protonated organic additive comprises at least one of polyamine and polyimide.

31. A method comprising:
preparing a pattern on a substrate to provide an exposed conductive portion bordered by a non-conductive wall;
placing the substrate in an electrolytic solution, the electrolytic solution including a plurality of metallic ions and an accelerator, the accelerator comprising at least one of bis-(sodium sulfopropyl)-disulfide and 3-mercapto-1-propanesulfonic acid-sodium salt;
applying a voltage across the electrolytic solution and the conductive portion of the substrate to cause the metallic ions to be reduced to metal and deposited on the conductive portion,
wherein the deposited conductive portion is characterized as conductive bumps having a domed upper surface for connecting portions of the substrate to a package substrate; and
removing the substrate pattern.

32. The method of claim 31, wherein the electrolytic solution further comprises a protonated organic additive.

33. The method of claim 32, wherein the protonated organic additive comprises at least one of polyamine and polyimide.

34. The method of claim 31, wherein the electrolytic solution further comprises an acid.

35. The method of claim 31, wherein the electrolytic solution further comprises a surfactant.

36. The method of claim 34, wherein the acid comprises at least one of sulfuric acid, methane sulfonic acid, benzene sulfonic acid, picryl sulfonic acid, ethane sulfonic acid, and propane sulfonic acid.

37. The method of claim 35, wherein the surfactant comprises at least one of polyethylene glycol and polypropylene glycol.

38. The method of claim 31, wherein the metallic ions are copper ions.

39. The method of claim 31, wherein a concentration of the accelerator is between approximately 10 ppm and 500 ppm.

40. The method of claim 32, wherein a concentration of the protonated organic additive is between approximately 0.5 g/L and 2 g/L.

41. The method of claim 34, wherein a concentration of the acid is between approximately 5 g/L and 150 g/L and a concentration of the metallic ions is between approximately 10 g/L and 60 g/L.

42. The method of claim 35, wherein a concentration of the surfactant is between approximately 0.5 g/L and 2 g/L.

43. The method of claim 31, wherein the substrate is a semiconductor substrate having an integrated circuit formed therein and the conductive portion is electrically connected to the integrated circuit.

44. A method for forming contact formations on a semiconductor substrate comprising:
    preparing a pattern on said semiconductor substrate to provide at least an exposed conductive portion, the semiconductor substrate having at least one integrated circuit formed therein and the at least one exposed conductive portion bordered by a non-conductive wall, the exposed conductive portion being electrically connected to the at least one integrated circuit;
    placing the substrate in an electrolytic solution, the electrolytic solution including a plurality of metallic ions and an accelerator, the accelerator comprising at least one of bis-(sodium sulfopropyl)-disulfide and 3-mercapto-1-propanesulfonic acid-sodium salt;
    applying a voltage across the electrolytic solution and the at least one conductive portion of the substrate to cause the metallic ions to be reduced to metal and deposited on the at least one conductive portion to form at least one contact formation on the at least one conductive portion, wherein the contact formation on the conductive portion is characterized as conductive bumps having a domed upper surface for connecting portions of the substrate to a package substrate; and
    removing the substrate pattern.

45. The method of claim 44, wherein the electrolytic solution further comprises a protonated organic additive.

46. The method of claim 45, wherein the protonated organic additive comprises at least one of polyamine and polyimide.

47. The method of claim 44, wherein the electrolytic solution further comprises an acid.

48. The method of claim 44, wherein the electrolytic solution further comprises a surfactant.

49. The method of claim 47, wherein the acid comprises at least one of sulfuric acid, methane sulfonic acid, benzene sulfonic acid, picryl sulfonic acid, ethane sulfonic acid, and propane sulfonic acid.

50. The method of claim 48, wherein the surfactant comprises at least one of polyethylene glycol and polypropylene glycol.

51. The method of claim 44, wherein the metallic ions are copper ions.

52. The method of claim 44, wherein a concentration of the accelerator is between approximately 10 ppm and 500 ppm.

53. The method of claim 45, wherein a concentration of the protonated organic additive is between approximately 0.5 g/L and 2 g/L.

54. The method of claim 47, wherein a concentration of the acid is between approximately 5 g/L and 150 g/L and a concentration of the metakc ions is between approximately 10 g/L and 60 g/L.

55. The method of claim 48, wherein a concentration of the surfactant is between approximately 0.5 g/L and 2 g/L.

56. The method of claim 44, wherein the integrated circuit is a microprocessor.

57. A method for forming contact formations on a semiconductor substrate comprising:
    preparing a pattern on said semiconductor substrate to provide at least an exposed conductive portion, the semiconductor substrate having at least one integrated circuit formed therein and the at least one exposed conductive portion being electrically connected to the at least one integrated circuit;
    placing said semiconductor substrate in a first electrolytic solution, the first electrolytic solution including a plurality of metallic ions;
    applying a voltage across the electrolytic solution and the at least one conductive portion of the substrate while the semiconductor substrate is within the first electrolytic solution to cause a portion of the plurality of metallic ions to be reduced to metal and deposited on the at least one conductive portion;
    placing said semiconductor substrate in a second electrolytic solution, the second electrolytic solution including said plurality of metallic ions and an accelerator, the accelerator comprising at least one of bis-(sodium sulfopropyl)-disulfide and 3-mercapto-1-propanesulfonic acid-sodium salt;
    applying a voltage across the electrolytic solution and the at least one conductive portion of the substrate while the semiconductor substrate is within the second electrolytic solution to cause the a portion of the plurality of metallic ions to be reduced to metal and deposited on the at least one conductive portion to form at least one contact formation on the at least one conductive portion, wherein the contact formation on the conductive portion is characterized as conductive bumps for connecting portions of the substrate to a package substrate; and
    removing the substrate pattern.

58. The method of claim 57, wherein the second electrolytic solution further comprises a protonated organic additive.

59. The method of claim 57, wherein the plurality of metallic ions is copper ions.

60. The method of claim 58, wherein the protonated organic additive comprises at least one of polyamine and polyimide.

* * * * *

UNITED STATES PATENT AND TRADEMARK OFFICE
CERTIFICATE OF CORRECTION

| | | |
|---|---|---|
| PATENT NO. | : 7,442,634 B2 | Page 1 of 1 |
| APPLICATION NO. | : 11/019857 | |
| DATED | : October 28, 2008 | |
| INVENTOR(S) | : Dubin et al. | |

It is certified that error appears in the above-identified patent and that said Letters Patent is hereby corrected as shown below:

In column 10, at line 6, delete "metakc" and insert --metallic--.

Signed and Sealed this

Fourteenth Day of April, 2009

JOHN DOLL
*Acting Director of the United States Patent and Trademark Office*